United States Patent [19]
de Fresart et al.

[11] Patent Number: 5,286,661
[45] Date of Patent: Feb. 15, 1994

[54] METHOD OF FORMING A BIPOLAR TRANSISTOR HAVING AN EMITTER OVERHANG

[75] Inventors: Edouard D. de Fresart, Tempe; John W. Steele, Chandler, both of Ariz.

[73] Assignee: Motorola, Inc., Schaumburg, Ill.

[21] Appl. No.: 935,508

[22] Filed: Aug. 26, 1992

[51] Int. Cl.$^5$ ......................................... H01L 21/265
[52] U.S. Cl. ........................................ 437/31; 437/33; 437/90; 437/89; 437/201
[58] Field of Search ................... 437/31, 89, 909, 201, 437/33, 133, 202, 90, 91; 148/DIG. 10, DIG. 11, DIG. 50

[56] References Cited

U.S. PATENT DOCUMENTS

| | | | |
|---|---|---|---|
| 3,889,359 | 6/1975 | Rand | 437/202 |
| 4,889,824 | 12/1989 | Solle et al. | 437/31 |
| 4,954,457 | 9/1990 | Jambotka | 437/31 |
| 4,962,053 | 10/1990 | Spratt et al. | 437/33 |
| 5,073,508 | 12/1991 | Villalon | 437/31 |
| 5,166,081 | 11/1992 | Inada et al. | 437/31 |

FOREIGN PATENT DOCUMENTS

| | | | |
|---|---|---|---|
| 0123724 | 7/1983 | Japan | 437/31 |
| 0202963 | 8/1988 | Japan | 437/31 |
| 0287058 | 11/1988 | Japan | 437/31 |

OTHER PUBLICATIONS

Ganin et al., "Epitaxial-Base Double-Poly Self-Aligned Bipolar Transistor", International Electron Dev. Metting, pp. 603-606, Dec. 1990.
Martin et al., "Polysilicon Emitter p-n-p Transistor", IEEE Trans. on Elec. Dev., vol. 36, No. 6, pp. 1139-1144, Jun. 1989.

*Primary Examiner*—Brian E. Hearn
*Assistant Examiner*—Tuan Nguyen
*Attorney, Agent, or Firm*—Robert F. Hightower; Joe E. Barbee

[57] ABSTRACT

A bipolar transistor (10) is formed by using low temperature epitaxial deposition in order to form a base layer (14) of the transistor (10). A dielectric (16, 17, 18) is applied to the base layer (14) and an emitter opening (21) having sloping sidewalls is formed in the dielectric (16, 17, 18). Low temperature epitaxial deposition is also used for forming an emitter (24) within the emitter opening (21). The emitter opening (21) forms sloping sidewalls on the emitter (24) thereby forming an emitter overhang that overlies the base layer (14). The width (26) of the emitter overhang determines an extrinsic base width of the transistor (10).

15 Claims, 3 Drawing Sheets

METHOD OF FORMING A BIPOLAR TRANSISTOR HAVING AN EMITTER OVERHANG

BACKGROUND OF THE INVENTION

The present invention relates, in general, to semiconductor devices, and more particularly, to bipolar transistors.

In the past, the semiconductor industry has utilized a variety of methods to form bipolar transistors. One problem associated with the prior methods is controlling dopant distributions within the transistor's base. Prior transistor formation methods require either emitter implant annealing, oxide sidewall formation, or other high temperature (above 900° C. Celsius) operations that disturb dopant distributions within the transistor's base layer. Such methods often result in a transistor having high base leakage current that degrades the transistor's efficiency. Additionally, disturbing the dopants modifies the transistor's current gain.

In addition, the bipolar transistors formed by the prior implementation methods generally have non self-aligned emitter-base contacts. Consequently, extra space must be provided between the emitter and base contacts in order to ensure that the contacts do not overlap. The extra space increases the transistor's cost, and increases base resistance thereby degrading the transistor's performance.

Accordingly, it is desirable to have a method of forming a bipolar transistor that does not disturb base dopant profiles, that results in a transistor having low base leakage current, that provides accurate control of the transistor's current gain, and that has self-aligned emitter-base contacts.

SUMMARY OF THE INVENTION

A method of forming a bipolar transistor includes epitaxially forming a base layer of the transistor on a substrate. A dielectric is applied to the base layer and an emitter opening having sloping sidewalls is formed in the dielectric. An emitter is formed within the opening to ensure the top of the emitter is wider than the bottom of the emitter. The wide portion of the emitter forms an emitter overhang.

DETAILED DESCRIPTION OF THE DRAWINGS

Figure 1:
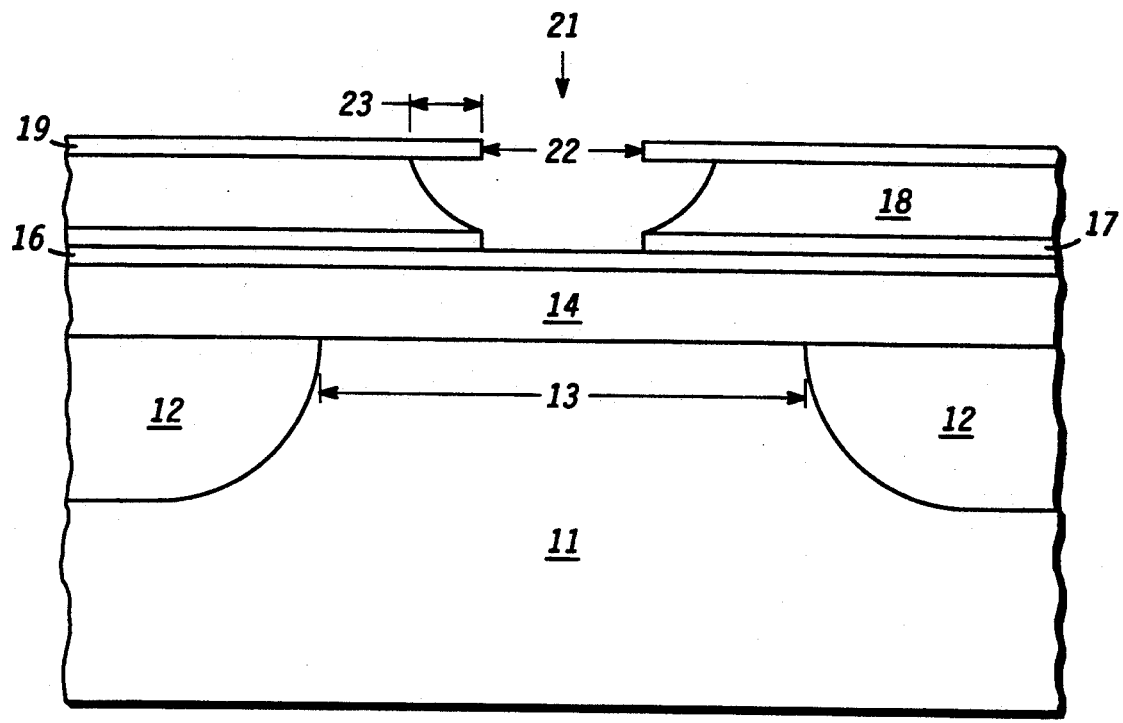
FIG. 1 illustrates an enlarged cross-sectional portion of a bipolar transistor in accordance with the present invention.

FIG. 1 illustrates an enlarged cross-sectional portion of a bipolar transistor 10 at a stage of manufacturing. A collector region of transistor 10 is formed as a doped region on a substrate 11, and has a lateral width 13. The collector region is surrounded by field oxide areas 12 which isolate transistor 10 from other structures formed on substrate 11. As will be seen hereinafter, transistor 10 is formed using a variety of different materials as mask layers. The materials of the mask layers are selected to provide a process that results in accurate extrinsic base width control.

An epitaxial base layer 14 is applied to substrate 11, and covers the collector region and at least a portion of each field oxide area 12. Epitaxial base layer 14 is formed by low temperature epitaxial deposition using in-situ doping in order to accurately control the position of dopants within layer 14. Layer 14 can be a single silicon layer or a multi-layer structure, and generally is deposited at a temperature between approximately 450 and 850 degrees Celsius (° C.). In the preferred embodiment, the epitaxial deposition is performed at a temperature between approximately 650°-700° C. by atmospheric or reduced pressure chemical vapor deposition (APCVD or RPCVD). Also in this preferred embodiment, layer 14 is a tri-layer structure comprising a layer of intrinsic silicon having a thickness between 100 and 200 nanometers, a boron doped silicon-germanium alloy layer having a thickness of approximately fifty to ninety nanometers, and a boron-doped silicon cap layer having a thickness between twenty and forty nanometers. Low temperature deposition of such a three-layer base epitaxial structure prevents dopant diffusion during the deposition.

Layer 14 is covered by a silicon dioxide layer 16. Then, layer 16 is covered with a layer of silicon nitride 17. Layer 16 functions as a stress relief for silicon nitride 17, and also as an etch stop during subsequent etching of nitride 17. In the preferred embodiment, layer 16 has a thickness of approximately twenty-five to thirty-five nanometers and nitride 17 has a thickness of approximately fifteen to one hundred fifty nanometers. Thereafter, a dielectric layer 18 is applied to silicon nitride 17 followed by covering layer 18 with a polysilicon layer 19. As will be seen hereinafter, layer 16, nitride 17, and layers 18 and 19 function as a sacrificial layer that is used as a mask to control the shape and dimensions of the emitter of transistor 10. The materials used for layer 16, nitride 17, and layers 18 and 19 are selected to provide a predetermined emitter shape and dimension. Also, the thickness of layer 18 determines the extrinsic base width of transistor 10. Consequently, the thickness of layer 18 is an important parameter in the formation of transistor 10, and generally varies from approximately 200 to 400 nanometers. In the preferred embodiment, layer 18 is silicon dioxide formed by low temperature deposition. This preferred embodiment of layer 18 has a thickness of approximately 200 to 350 nanometers in order to form an extrinsic base width that is not greater than approximately 0.2 microns.

Subsequent to applying layer 19, an opening 21 is formed in layer 19 so that a width 22 of opening 21 is less than width 13. Width 22 will subsequently define the emitter width of transistor 10, and generally is as small as can possibly be formed by the lithography equipment utilized in forming transistor 10. In the preferred embodiment, width 22 is less than approximately 0.8 microns. Opening 21 is formed by an anisotropic polysilicon reactive ion etch that does not affect layer 18. Then, polysilicon layer 19 and opening 21 are used as a mask while isotropically etching an emitter opening through layer 18. The isotropic etching of layer 18 creates an emitter opening having sloping sidewalls that undercut layer 19 by an undercut distance 23. Distance 23 generally is approximately equal to the thickness of layer 18. In the preferred embodiment, distance 23 is less than approximately 0.2 microns.

Formation of the emitter opening is continued by again using polysilicon layer 19 as a mask while anisotropically etching the emitter opening through nitride 17. The anisotropic etching does not affect layer 18, and stops when the silicon dioxide of layer 16 is exposed. Since the etching is performed through opening 21, the emitter opening through layer 17 has a width approximately equal to width 22. During this anisotropic etch operation, a portion of polysilicon layer 19 is also removed, thus, layer 19 is formed to have a thickness that is greater than the thickness of layer 17.

Figure 2:
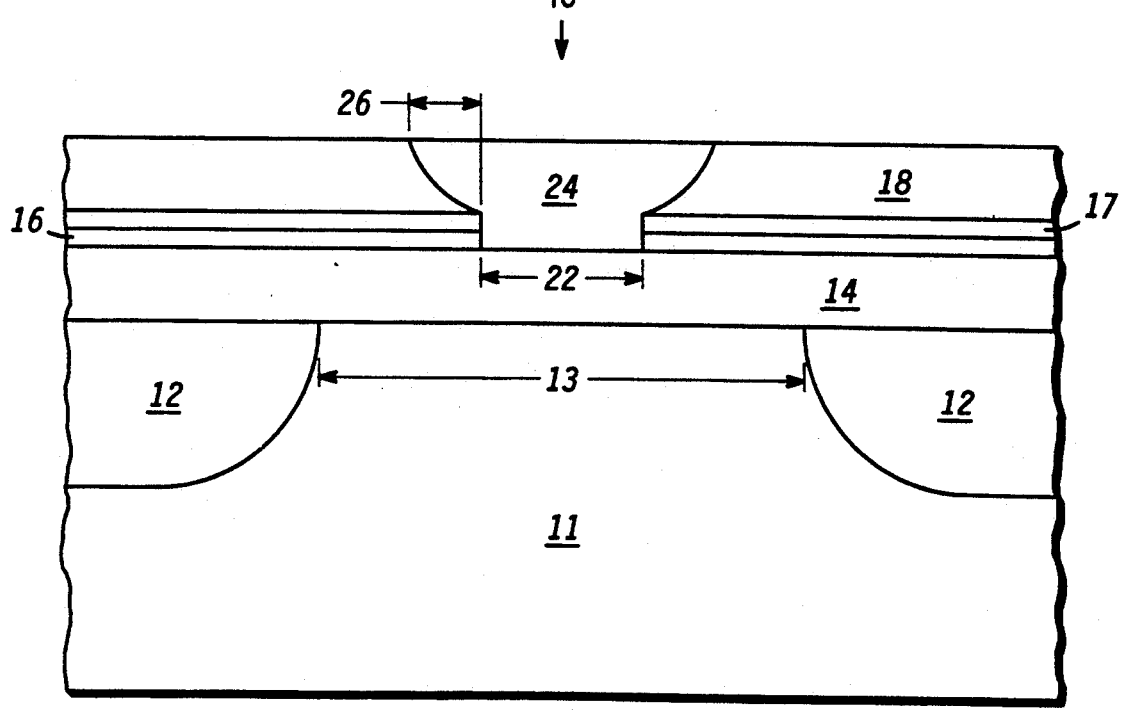
FIGS. 2-4 illustrate the transistor of FIG. 1 at various implementation stages in accordance with the present invention.

FIG. 2 illustrates transistor 10 of FIG. 1 at a subsequent manufacturing stage. Elements of FIG. 2 that are the same as FIG. 1 have the same reference numerals. After forming the emitter opening in nitride 17, layer 19 of FIG. 1 is removed by an isotropic plasma or wet etch that is selective to polysilicon. This permits removing layer 19 (FIG. 1) without disturbing the width of the opening through nitride 17. Then, layer 16 is wet etched through the emitter opening in nitride 17 thereby continuing the emitter opening through layer 16. The portion of the emitter opening through layer 16 has a width approximately equal to width 22, and exposes the active portion of base layer 14. While etching layer 16, a portion of layer 18 is also removed. Since removing portions of layer 14 lowers the performance of transistor 10, it is important not to over-etch layer 16. In the preferred embodiment, layer 16 is etched with a buffered 10:1 hydrofluoric acid solution for less than approximately thirty-five seconds at a temperature of about 30° C.

An emitter 24 is formed within the emitter opening through nitride 17, and layers 16 and 18. Emitter 24 can be either silicon or polysilicon that is formed by low temperature epitaxial deposition using in-situ doping in order to prevent dopant migrations within epitaxial base layer 14 and also within emitter 24. The deposition of emitter 24 can either be selective or non-selective, and typically is performed below approximately 850° C. In the preferred embodiment, emitter 24 is silicon that is selectively deposited by reduced pressure chemical vapor deposition (RPCVD) at a temperature of approximately 800° C. or by atmospheric pressure chemical vapor deposition (APCVD) at approximately 650° C. The sloping sidewalls within the emitter opening results in emitter 24 also having sloping sidewalls. This sidewall configuration produces an emitter overhang wherein the top of emitter 24 overhangs the bottom by an overhang distance 26. Since distance 26 is formed by the sidewalls of layer 18, distance 26 is substantially equal to distance 23 of FIG. 1.

Figure 3:
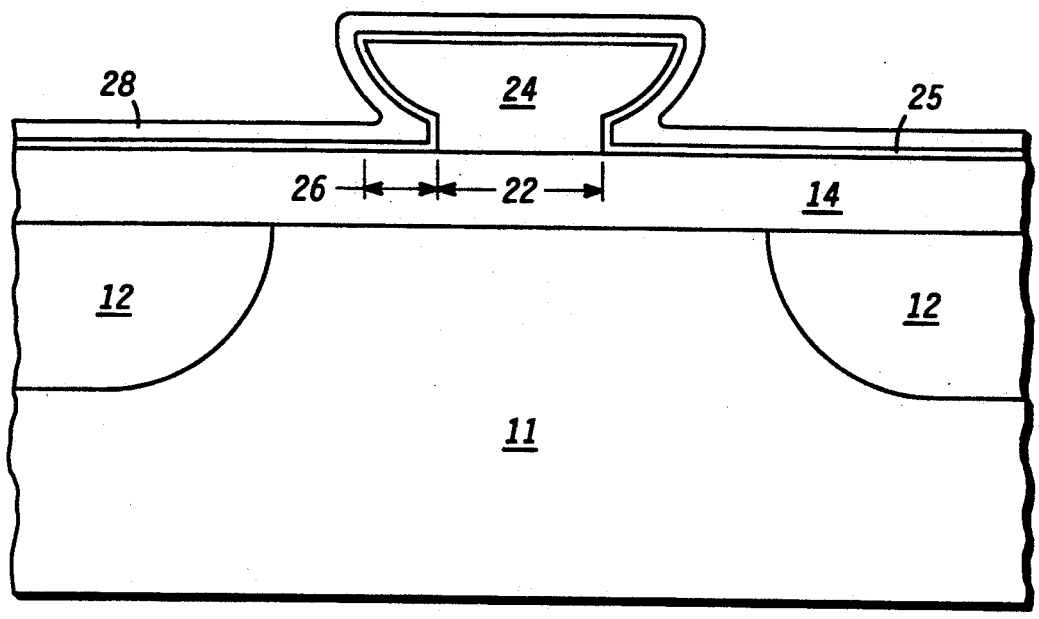

FIG. 3 illustrates transistor 10 of FIG. 2 at a subsequent manufacturing stage. Elements of FIG. 3 that are the same as FIG. 2 have the same reference numerals. Subsequent to depositing emitter 24, a buffered hydrofluoric acid etch that selectively etches silicon dioxide but not silicon nitride or polysilicon is used to remove layer 18 (FIG. 2). Then, layers 17 and 16 (FIG. 2) are selectively removed by an isotropic wet etch that does not affect emitter 24 and layer 14, thereby exposing emitter 24 and layer 14. A silicon dioxide pad layer 25 is applied to layer 14 in addition to the sidewalls and top of emitter 24. Thereafter, a silicon nitride protective layer 28 is applied covering silicon dioxide pad layer 25.

Figure 4:
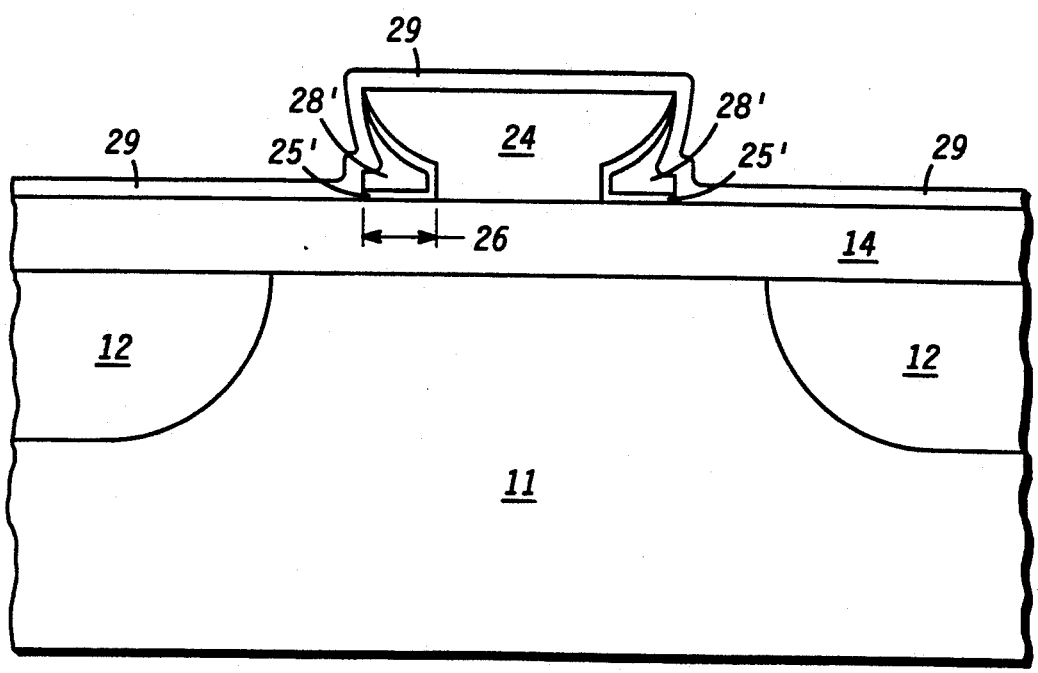

Referring to FIG. 4, the transistor of FIG. 3 is illustrated at a subsequent manufacturing stage. Elements of FIG. 4 that are the same as FIG. 3 have the same reference numerals. An anisotropic reactive ion etch is utilized to remove portions of layer 28. During the etching, layer 25 serves as an etch stop that prevents the etching from affecting layer 14 and emitter 24. The anisotropic etch removes portions of layer 28 (FIG. 3) from the top of emitter 24, and also portions that are not covered by the overhang portion of emitter 24. Consequently, a protective area or second silicon nitride 28' is left on top of the portion of layer 25 that is along the sloping sidewalls of emitter 24 and also on the portion of layer 25 underlying the emitter overhang. Subsequently, exposed portions of layer 25 are removed by using a buffered hydrofluoric acid etch that is selective to the silicon dioxide of layer 25. Portions of layer 25 that are covered by silicon nitride 28' are unaffected by the oxide selective etch. Therefore, a portion of layer 25 remains under nitride 28' as a layer 25'.

Self-aligned emitter and base contacts are formed by applying a layer of platinum 29 that covers exposed portions of layer 14, exposed portions of layer 25' and nitride 28', and the top of emitter 24. Platinum 29 is annealed in order to convert portions of platinum 29 that contact silicon into a platinum silicide alloy. Thus, portions of platinum 29 along the top of emitter 24 and along layer 14 are converted to platinum silicide, but, the portion of platinum 29 in contact with nitride 28' and layer 25' remains platinum. Other conductor materials can be used for platinum 29 as long as the deposition temperature is less than approximately 900° C., and the material selectively forms a silicide. Suitable materials include titanium and cobalt.

Figure 5:
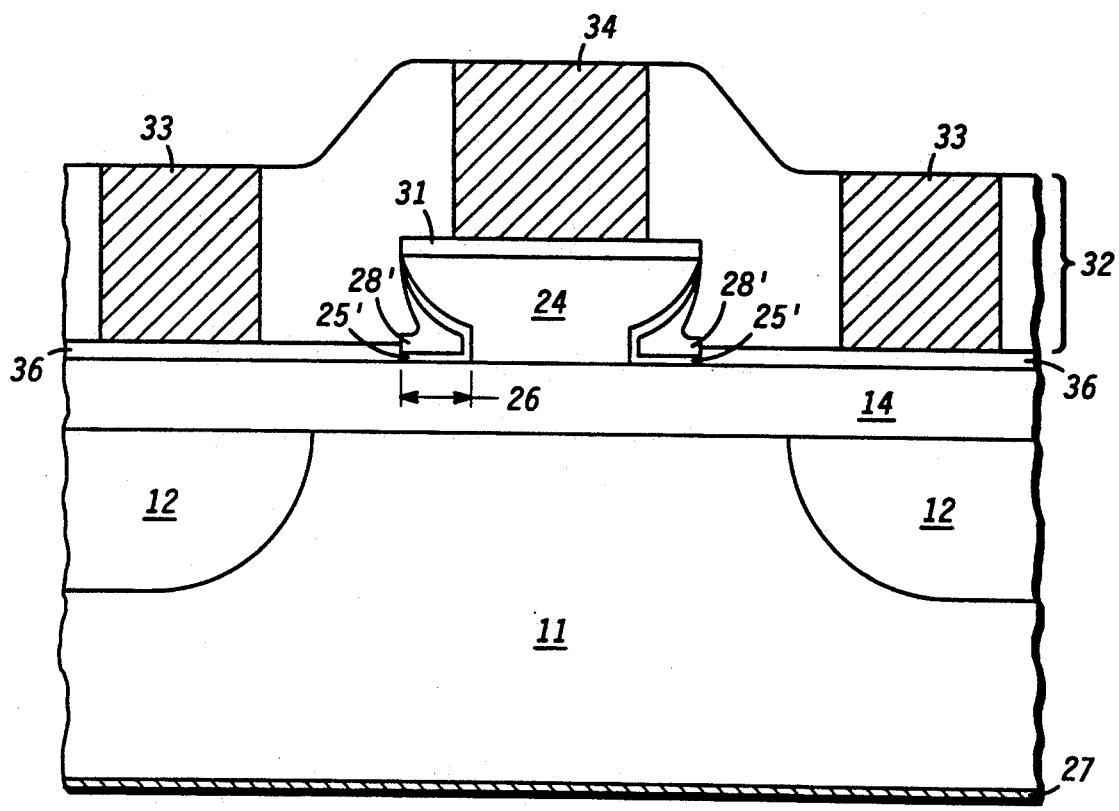
FIG. 5 illustrates the transistor of FIG. 4 after forming emitter and base contacts in accordance with the present invention.

Referring to FIG. 5, a subsequent step in forming transistor 10 of FIG. 4 is illustrated. Portions of FIG. 5 that are the same as FIG. 4 have the same reference numerals. Since aqua regia attacks platinum but not platinum silicide, unreacted portions of platinum 29 (FIG. 4) are removed with aqua regia thereby leaving a platinum silicide emitter contact 31 on top of emitter 24, and a plurality of platinum silicide base contacts 36 in contact with layer 14. This method of forming base and emitter contacts results in self-aligned contacts that are electrically isolated. Additionally, the method provides an extrinsic base width (the distance between base contact 36 and the intersection of emitter 24 with layer 14) that is determined only by the overhang distance 26.

After contacts 31 and 36 have been formed, the surface of transistor 10 is covered with a dielectric layer 32. Vias or conductor openings are formed through layer 32 in order to expose portions of contacts 31 and 36. These openings are filled with a conductor material in order to form base conductors 33, and an emitter conductor 34. In the preferred embodiment, a conductor is also applied to a second or bottom surface of substrate 11 in order to form a collector contact 27.

Since dopants in the base of transistor 10 have not been disturbed by high temperature processing operations, the base resistance is low thereby increasing the maximum operating frequency of transistor 10. Additionally, the low temperature processing minimizes the base leakage current of transistor 10. This is especially important at low base-emitter bias voltages typically less than approximately 0.4 volts, wherein the result is a high gain that ensures the collector current is larger than the base current. At such low base-emitter bias voltages, typical prior art transistors generally have a base current that is greater than the collector current.

By now it should be appreciated that there has been provided a novel way to fabricate a bipolar transistor. Using low temperature deposition to form the emitter, and low temperature processing steps to control the emitter's shape provides accurate control of dopants in the transistor's base layer. Such dopant control provides a method that accurately controls a transistor's current gain. Using a sacrificial layer to control the emitter's shape assists in forming self-aligned base emitter contacts. Creating an emitter having an overhang facilitates accurate control of the transistors' extrinsic base width thereby reducing the transistor's base resistance and increasing the transistor's performance. The overhang portion of the emitter also functions as a mask to assist in forming the self-aligned emitter and base contacts thereby minimizing the transistor's area and reducing the transistor's cost.

I claim:

1. A method of forming a bipolar transistor comprising providing a semiconductor substrate having a collector region wherein the collector region has a first width;

using low temperature epitaxial deposition for applying a base layer on the collector region wherein the base layer is in-situ doped;

forming a sacrificial layer on the base layer wherein the sacrificial layer includes a first silicon dioxide layer;

covering the sacrificial layer with a layer of polysilicon having a first thickness;

forming an opening through the polysilicon wherein the opening overlays the collector region and has a second width that is less than the first width;

forming an emitter opening through the sacrificial layer by isotropically etching the sacrificial layer while using the polysilicon as a mask wherein the emitter opening undercuts the polysilicon and forms sloping sidewalls in the sacrificial layer, and wherein an active portion of the base layer is exposed;

removing the polysilicon by selectively etching the polysilicon;

selectively depositing an in-situ doped emitter on the active portion of the base layer wherein the emitter fills the emitter opening, and wherein the emitter has a top and also has sidewalls with a sloping portion of the sidewalls of the emitter along the sloping sidewalls of the sacrificial layer so that the sloping portion of the sidewalls of the emitter forms an emitter overhang that overlays an extrinsic portion of the base layer;

removing the sacrificial layer by selective etching that does not etch the emitter thereby exposing a first portion of the base layer that includes the extrinsic portion of the base layer;

covering the emitter, and the first portion of the base layer with a silicon nitride protective layer; and forming a protective area on the extrinsic portion of the base layer and on the sloping portion of the sidewalls by anisotropically etching the silicon nitride protective layer for the purpose of removing the silicon nitride protective layer from the top of the emitter and from the base layer external to the emitter overhang.

2. The method of claim 1 further including depositing a layer of platinum covering the base layer that is external to the emitter overhang, the protective area, and the top of the emitter;

converting portions of the layer of platinum that are on the top of the emitter and on the base layer to platinum silicide by annealing the layer of platinum wherein the layer of platinum on the protective area remains unreacted platinum; and forming a platinum silicide emitter contact on the top of the emitter and a platinum silicide base contact on the base layer wherein the base contact is self-aligned to the to the emitter contact by selectively removing the unreacted platinum.

3. The method of claim 2 further including covering the platinum silicide and the protective area, with a dielectric; forming an emitter conductor opening through the dielectric wherein the emitter conductor opening overlays the emitter contact, and a base conductor opening through the dielectric wherein the base conductor opening overlays the base contact; and filling the emitter conductor opening and the base conductor opening with a conductor.

4. The method of claim 1 wherein using epitaxial deposition for applying the epitaxial base layer includes applying a multi-layer epitaxial base layer by applying an intrinsic silicon layer having a thickness of approximately 100 to 200 nanometers, applying a boron doped layer that is one of silicon or silicon-germanium which has a thickness of approximately 50 to 100 nanometers, and applying a boron doped silicon layer having a thickness of approximately 20 to 40 nanometers.

5. The method of claim 1 wherein forming the opening through the polysilicon wherein the opening overlays the collector region and has the second width that is less than the first width includes forming the second width to be less than approximately 0.8 microns.

6. The method of claim 1 wherein forming the opening through the polysilicon includes using a reactive ion etch that etches the polysilicon but not the sacrificial layer.

7. The method of claim 1 wherein forming the emitter opening through the sacrificial layer by isotropically etching the sacrificial layer includes etching with a wet chemical etch until the emitter opening undercuts the polysilicon by an amount not greater than approximately 0.2 microns.

8. The method of claim 1 wherein selectively depositing the in-situ doped emitter includes selectively depositing a silicon epitaxial emitter by using reduced pressure chemical vapor deposition at a temperature of less than approximately 800° C.

9. The method of claim 1 wherein forming the sacrificial layer includes covering the base layer with a second silicon dioxide layer, covering the second silicon dioxide layer with a first silicon nitride layer having a second thickness that is less than the first thickness, and covering the first silicon nitride layer with the first silicon dioxide layer.

10. The method of claim 9 wherein forming the emitter opening through the sacrificial layer includes forming the emitter opening through the first silicon nitride layer by using the polysilicon as a mask while anisotropically etching the first silicon nitride layer with a reactive ion etch thereby forming the emitter opening through the first silicon nitride layer to have a third width that is approximately equal to the second width.

11. The method of claim 10 further including forming the emitter opening through the second silicon dioxide layer by removing a portion of the second silicon dioxide layer through the emitter opening in the first silicon nitride layer thereby exposing the active portion of the base layer.

12. A method of forming a bipolar transistor comprising:
 providing a semiconductor substrate having a collector region wherein the collector region has a first width;
 covering the collector region with an epitaxial base layer;
 applying a first dielectric overlying the epitaxial base layer;
 forming an opening through the first dielectric wherein the opening has sloping sidewalls;
 forming an emitter filling the opening so that the emitter has sloping sidewalls formed by the sloping sidewalls of the opening in the first dielectric wherein the sloping sidewalls of the emitter form an emitter overhang having a width;
 removing the first dielectric, and forming a second dielectric along the sloping sidewalls of the emitter and on the base layer underlying the emitter overhang prior to forming a contact on the base layer;
 depositing a conductor material covering a top of the emitter, the second dielectric, and portions of the base layer that are not underlying the emitter overhang;
 forming an alloy between the conductor and the top of the emitter, and between the conductor and the portions of the base layer; and
 removing unreacted portions of the conductor thereby forming an extrinsic base width that is approximately equal to the width of the emitter overhang.

13. A method of forming a bipolar transistor comprising:
 providing a semiconductor substrate having a collector region wherein the collector region has a first width;
 covering the collector region with an epitaxial base layer;
 applying a first dielectric overlying the epitaxial base layer by covering the base layer with a first silicon dioxide layer, covering the first silicon dioxide layer with a silicon nitride layer, and covering the silicon nitride layer with a second silicon dioxide layer;
 forming an opening through the first dielectric wherein the opening has sloping sidewalls;
 forming an emitter filling the opening so that the emitter has sloping sidewalls formed by the sloping sidewalls of the opening in the firs dielectric wherein the sloping sidewalls of the emitter form an emitter overhang having a width.

14. The method of claim 13 wherein covering the collector region with the epitaxial base layer includes using epitaxial deposition at a temperature of approximately 450 to 800 degrees Celsius for applying the base layer including an intrinsic silicon layer having a thickness of approximately 100 to 200 nanometers, a boron doped layer that is one of silicon or silicon-germanium which has a thickness of approximately 50 to 100 nanometers, and a boron doped silicon layer having a thickness of approximately 20 to 40 nanometers.

15. The method of claim 13 wherein forming the emitter includes using reduced pressure chemical vapor deposition for selectively depositing an in-situ doped emitter wherein the emitter is doped with phosphorus.

* * * * *